United States Patent
Chen et al.

[11] Patent Number: 5,745,405
[45] Date of Patent: Apr. 28, 1998

US005745405A

[54] PROCESS LEAKAGE EVALUATION AND MEASUREMENT METHOD

[75] Inventors: Chan Yuan Chen; Kao Min Chi, both of Hsin-chu, Taiwan

[73] Assignee: Taiwan Semiconductor Manufacturing Company, LTD, Hsinchu, Taiwan

[21] Appl. No.: 703,078

[22] Filed: Aug. 26, 1996

[51] Int. Cl.$^6$ .................................................. G11C 11/00
[52] U.S. Cl. .......................... 365/154; 365/156; 365/201
[58] Field of Search .................................. 365/154, 156, 365/201, 230.03

[56] References Cited

U.S. PATENT DOCUMENTS

| | | | |
|---|---|---|---|
| 5,034,923 | 7/1991 | Kuo et al. | 365/189.01 |
| 5,355,331 | 10/1994 | Takase et al. | 365/154 |
| 5,450,353 | 9/1995 | Koike | 365/154 |
| 5,491,665 | 2/1996 | Sachder | 365/201 |
| 5,555,522 | 9/1996 | Amani et al. | 365/201 X |
| 5,559,745 | 9/1996 | Banik et al. | 365/201 |
| 5,566,110 | 10/1996 | Soenen et al. | 365/154 |
| 5,577,051 | 11/1996 | McClure | 365/201 X |

*Primary Examiner*—David C. Nelms
*Assistant Examiner*—Huan Hoang
*Attorney, Agent, or Firm*—George O. Saile; Stephen B. Ackerman

[57] ABSTRACT

A method and an apparatus for the measurement and evaluation of leakage currents within an SRAM cell is described. The leakage current is present in the cutoff device of a cross coupled pair of field effect transistors in a four transistor SRAM cell. Each of the load resistors of the SRAM cell is connected through a pass gate to a chain of high value resistances to the contact structure that is connected to a power supply voltage source. An expected value of leakage current is less than the quotient of the difference of the magnitude of the power supply voltage source and the threshold voltage of the cutoff field effect transistor of the cross coupled pair of field effect transistors, and the summation of the ohmic value of the load resistor of the SRAM cell and the ohmic value of all the resistors in the chain of high value resistance between the contact structure and the pass gate connecting the SRAM cell to the chain of high value resistances. If the leakage current is lower than the expected leakage current the SRAM cell has passed and if the leakage current is higher than the expected leakage current, the SRAM cell has failed. The measurement of a large number of SRAM cells will allow a sufficiently large sampling of data to evaluate the effects of modifying semiconductor parameters upon the leakage current within the SRAM cells.

11 Claims, 4 Drawing Sheets

PROCESS LEAKAGE EVALUATION AND MEASUREMENT METHOD

BACKGROUND OF THE INVENTION

1. Field of the Invention

This invention relates to static random access memories and in particular to methods, apparatus, and techniques for the evaluation of the variance of the magnitude currents within static random access memory devices as a result of modifying the semiconductor process parameters for fabricating static random access memories.

2. Description of Related Art

The design of static random access memories (SRAM) is well known in the art. A typical embodiment of an SRAM cell is shown in FIGS. 1a–c. Field effect transistors (FET) $M_2$ and $M_4$ form a cross coupled pair of FET's that form a latch. The FET's $M_1$ and $M_3$ are transfer gates that allow data to be written and read from the cross coupled pair $M_2$ and $M_4$. The resistors $R_{L1}$ and $R_{L2}$ are coupled between the power supply voltage source $V_{cc}$ and the cross coupled pair $M_2$ and $M_4$ to provide the necessary loading for the latching operation of the SRAM cell.

In operation one of the cross coupled pairs $M_2$ and $M_4$ will be in conduction and the other will be cutoff. If, for instance, FET $M_2$ is conducting, the current $I_1$ is the voltage drop across $R_{L1}$, divided by the value of the $R_{L1}$. In a typical design the voltage drop will approach that of the power supply voltage source and the resistance $R_{L1}$ will be on the order of $400 \times 10^9 \Omega$ or about 12.5 pA. With FET $M_2$ conducting, FET $M_4$ will be cutoff and the current $I_2$ is the leakage current from the drain to the source or the drain to bulk of the FET $M_4$. The major source of the leakage current is dependent on the magnitude of the channel length of the FET device design. If the channel length FET is relatively long the drain to bulk becomes the major path of the leakage current. However, if the channel length of the FET is relatively short, the drain to source becomes the major path of the leakage current. The magnitude of the leakage current should be smaller than that of $I_1$ by several orders of magnitude. However, if the process parameters used to fabricate the SRAM are varied the leakage current maybe sufficiently large such as to cause a fault within the SRAM cell.

The measurement and evaluation of the effects of the varying of process parameters on leakage current requires that the current for an array of cell be measured. The effects of the variance of the leakage has to extracted from the total current and then only as an average of the leakage on many SRAM chips on a processed wafer. This process requires many wafers and many changes in the process parameters to extract sufficient information to evaluate the effects of varying the process parameters.

FIG. 1b shows how a row of cells of an array of SRAM cells cell1, cell2, . . . , celln are connected to a power distribution network. The plurality of resistors R are serially connected to each other and the contact structures A and B. Each SRAM cell cell1, cell2, . . . , celln is connected at each intersection of the resistors R. The contact structures are connected to the power supply voltage source $V_{cc}$. Each resistor R has a value that is determined by the resistivity of the interconnecting metalization on the SRAM chip. This value will be very low such that the power supply voltage $V_{cc}$ of FIG. 1a will approach that of the power supply voltage source.

FIG. 1c is a diagram of an array of SRAM cells. The intersection of each column and each row will contain an SRAM cell like that of FIG. 1a. One column will contain the signals for the data to be written to a cell. Each row will have the power distribution network of FIG. 1b for the SRAM cells on the row. The row will also have the control signals that will activate the row of cells. As a column is activated and a row is activated, a cell is selected to be written to or to be read from.

U.S. Pat. No. 5,491,665 (Sachdev) discloses a CMOS SRAM that has an auxiliary circuit that will selectively test IDDQ to detect defects in any cells of the array of cells.

U.S. Pat. No. 5,355,331 (Takese, et al.) describes a static RAM with a test feature to detect soft defects that may cause a memory cell to act functionally a dynamic RAM.

U.S. Pat. No. 5,034,923 (Kuo, et al.) illustrates a semiconductor chip having both logic and memory sections formed. The structure allows the selective application of power to unused cells of the memory section to minimize leakage currents.

SUMMARY OF THE INVENTION

An object of this invention is the measurement of leakage currents within an array of SRAM cells. Another object of this invention is the evaluation of the effects of process variation by the comparison of many leakage currents within SRAM cells on wafers having different process parameters applied during fabrication.

To accomplish these and other objectives this invention is a method for the measurement and evaluation of leakage current variations as a result of variation of process parameters during the fabrication of SRAM chips. A semiconductor wafer is partitioned into a plurality of chips. On each chip is placed a plurality of arrays of SRAM cells. Each array of SRAM cells is organized into rows and columns of cells. On the chip is also placed contact structures to allow the coupling of a power supply voltage source to each of the SRAM cells.

Connected to each of the contact structures is a first plurality of series connected resistors and a second plurality of series connected resistors. At the intersection of each resistor of the series connected resistors is connected the drain of a pass gate FET. A pass gate select line is connected to the gate of the pass gate FET and an SRAM cell is connected to the source. Each SRAM cell is connected to the two pass gate FET's. The first and second plurality of series connected resistors, the pass gate FET's and the SRAM cells connected to the pass gate FET's form a row of the array of SRAM cells.

The contact structure is coupled to a power supply voltage source. The pass gate is activated and the leakage current within each SRAM cell is measured. The measured value of leakage current is compared to a calculated value. This process is repeated with each pass gate select line being sequentially activated and the leakage currents for each SRAM cell in an array of SRAM cells being measured.

By having a large number of measurements of leakage currents and comparisons to expected leakage currents, the effects of variation of process parameters during fabrication of SRAM's can be evaluated.

DETAILED DESCRIPTION OF THE INVENTION

Figure 2A:
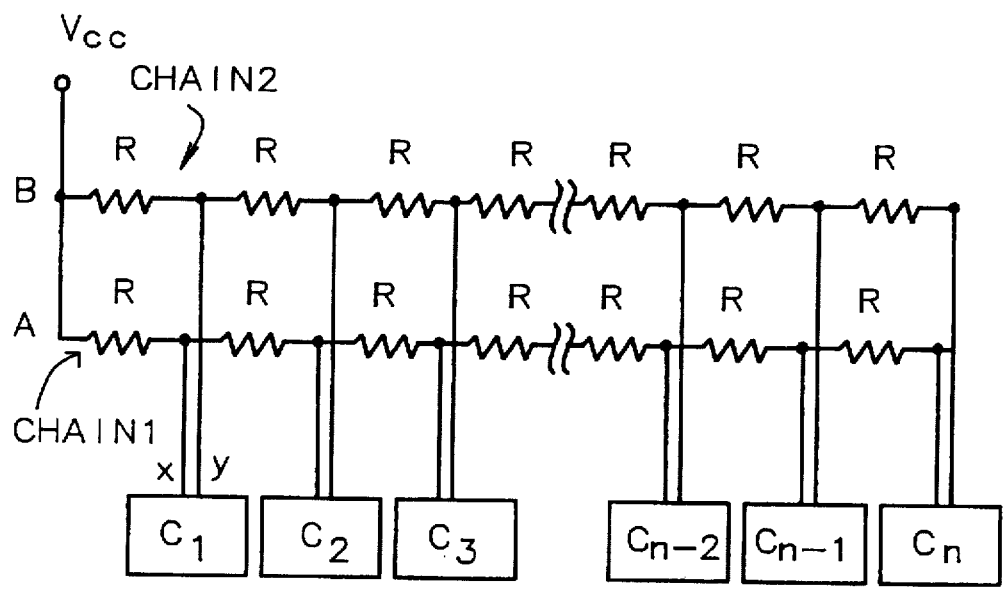
FIGS. 2a and 2b is schematic diagram of a row of SRAM cells showing their connectivity to the power supply voltage source for process leakage evaluation of this invention.
Figure 2B:
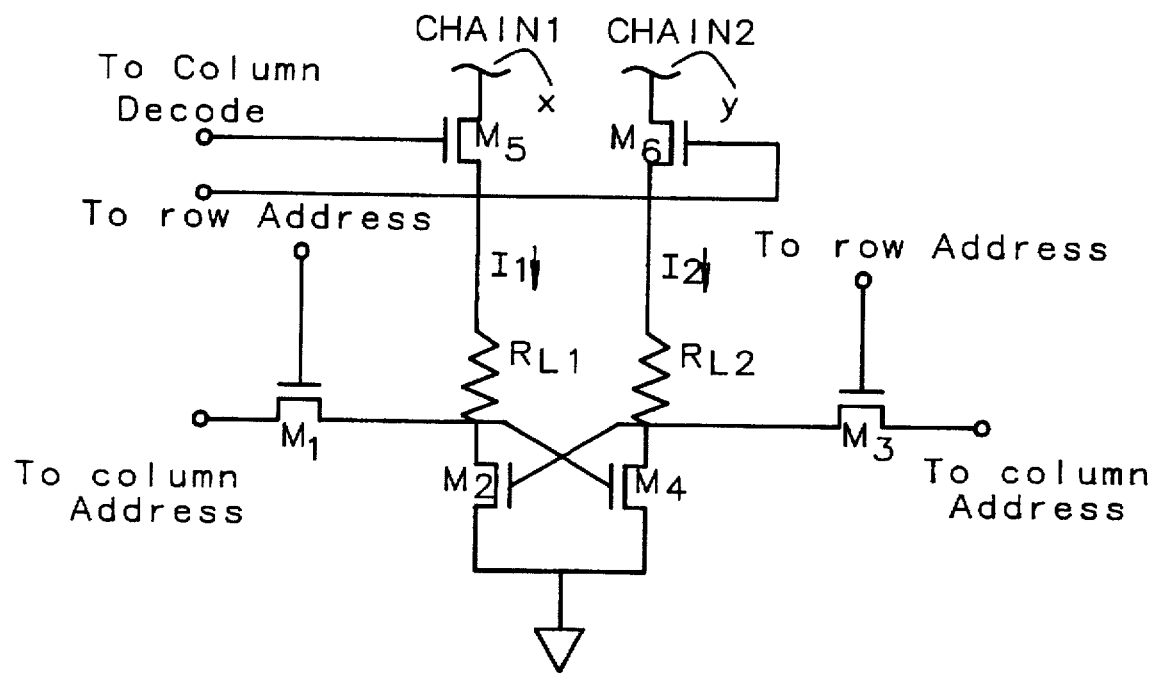

Referring to FIGS. 2a and 2b, the structure of a single row of an array of SRAM cells of this invention is shown. A row of cells $C_1, C_2, \ldots, C_{n-1}, C_n$ are connected to the chains chain1 and chain2 of series connected resistors R. One end of each chain chain1 and chain2 is connected to the power supply voltage source $V_{cc}$. Each resistor R of the resistor chains chain1 and chain2 are of a very high resistance value, on the order of $500 \times 10^9 \Omega$. Generally each resistor R would be fabricated as a polysilicon resistor.

Figure 1A:
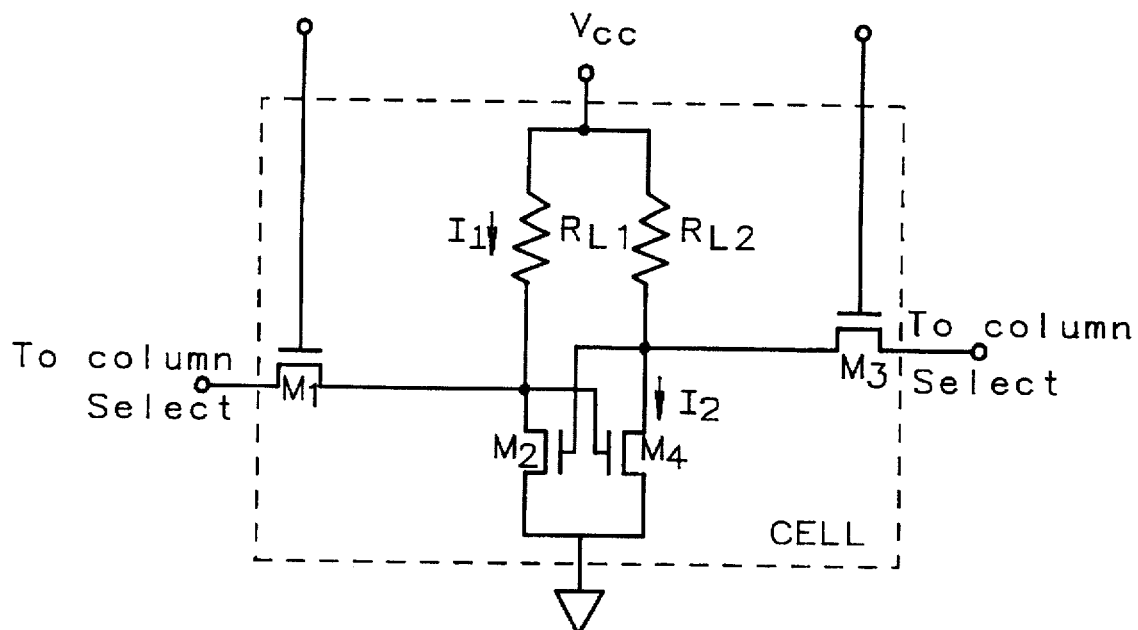
FIG. 1a is a schematic diagram of a four transistor SRAM cell.
Figure 1B:
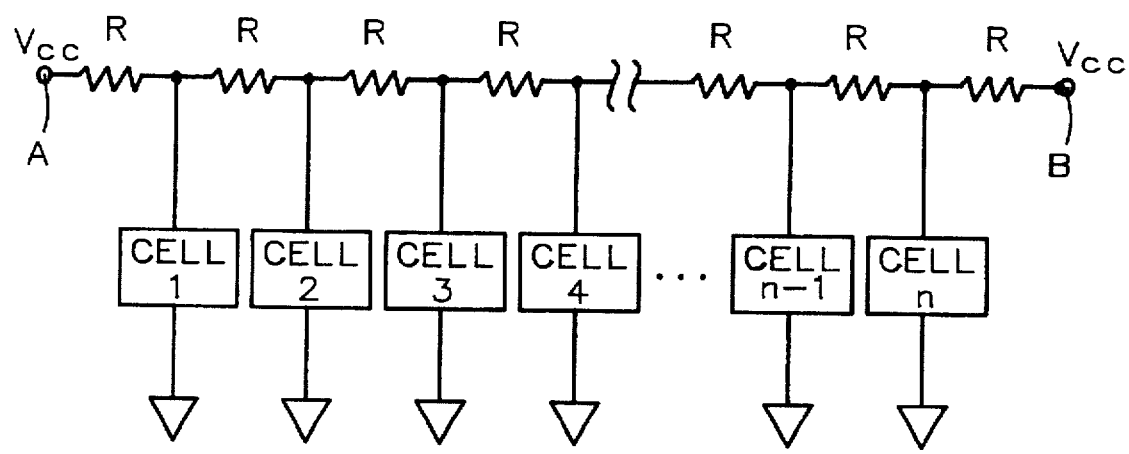
FIG. 1b is a schematic diagram of a row of SRAM cells showing their connectivity to the power supply voltage source.
Figure 1C:
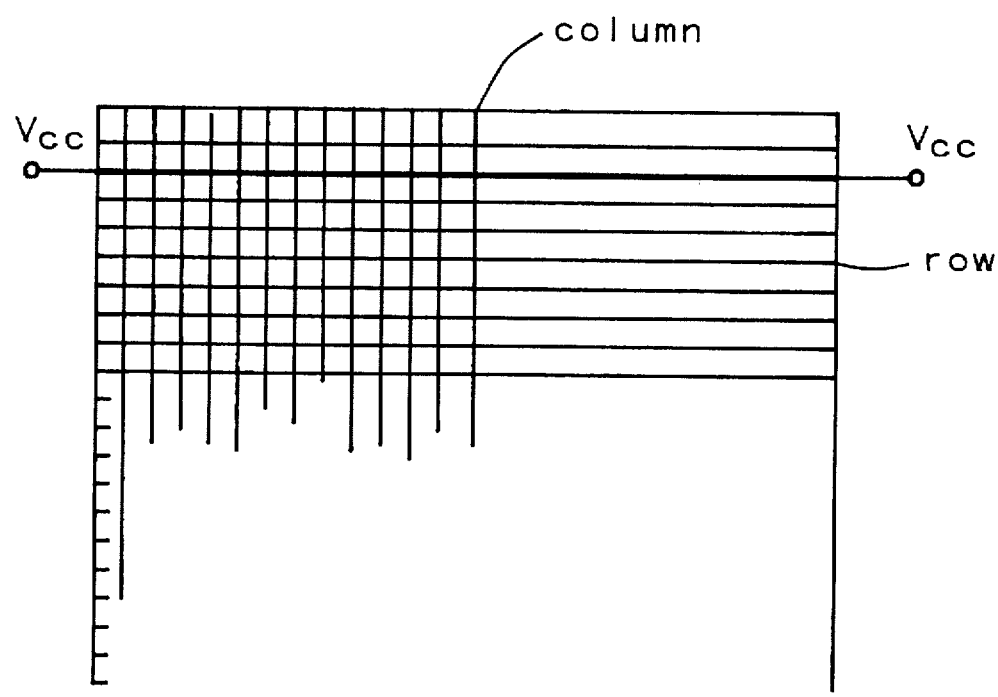
FIG. 1c is a diagram of the array structure of a plurality of SRAM cells.

The SRAM cells $C_1, C_2, \ldots, C_{n-1}, C_n$ have cross coupled FET's $M_2$ and $M_4$, transfer gates $M_1$ and $M_3$, and load resistors $R_{L1}$ and $R_{L2}$, which operate as described in FIG. 1a. However, instead of load resistors $R_{L1}$ and $R_{L2}$ being connected directly to the power supply voltage source $V_{cc}$ through the power supply distribution network of FIG. 1b, the load resistors $R_{L1}$ and $R_{L2}$ are now connected to the sources of the pass gate FET's $M_5$ and $M_6$ respectively.

The gates of pass gate FET's $M_5$ and $M_6$ are connected to pass gate select lines that are connected to the column decode circuitry to selectively activate either the gate of the FET $M_5$ or the gate of FET $M_6$. The drain of the pass gate $M_5$ is connected to an intersecting connection to two of the resistors R of chain1 and the drain of pass gate $M_6$ is connected to an intersecting connection of two resistors R of chain2.

A plurality of rows as shown in FIG. 2 are assembled to form an array and multiple arrays are placed on a semiconductor chip. Many chips are fabricated on a wafer. The ability to select individually each FET of the cross coupled FET's $M_2$ and $M_4$ will allow the measurement of the leakage current for each cell. The test structures can be placed as a test site on production wafers of SRAM's for monitoring or may populate entire wafers for wafer evaluation.

To perform an evaluation of the effects of process variation upon leakage current, a wafer containing multiple chips with the arrays of SRAM cells as described in FIG. 2 are connected to a power supply voltage source. Control signals to the column decode circuitry selectively activate each of the pass gates $M_5$ and $M_6$. The leakage current is now measured as the current being sourced from the voltage supply $V_{cc}$. The measured leakage current is compared to the expected leakage current, which is $$I = \frac{V_{cc} - V_t}{R_L + \sum_{j=1}^{n} R}$$

Where

I is the leakage current $I_1$ or $I_2$.

$V_{cc}$ is the magnitude of the power supply voltage source.

$V_T$ is the magnitude of the threshold voltage of an FET.

$R_L$ is the value of the resistance for resistors $R_{L1}$, and $R_{L2}$.

R is the value of the resistance for the interconnecting resistance R of FIG. 2.

n is the number of resistors from the connection of the power supply voltage source to the connection of the SRAM cell being measured.

If the leakage current is larger than the value of the expected leakage current as calculated above, the cell is considered to have failed.

Figure 3:
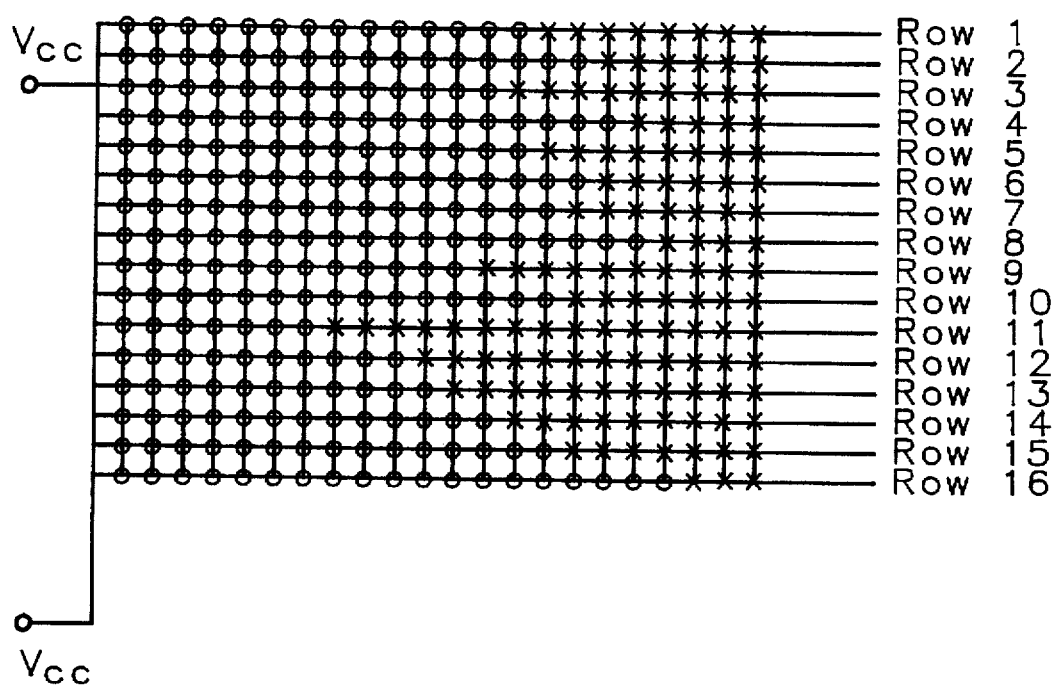
FIG. 3 is a diagram of a bit map of an array of SRAM cells as evaluated using the method of this invention.

FIG. 3 shows a bit map of an array of rows of cells (ROW1, ROW2, . . . , ROW16). Each 0 is a cell where the leakage current is less than the expected value as calculated above. And each X represent cells where the measure leakage current is greater than the expected leakage current as calculated above. From this information and from the value of the process parameters of the semiconductor fabrication, the effects of varying the process parameters upon the leakage current can be more directly assessed.

While this invention has been particularly shown and described with reference to the preferred embodiments thereof, it will be understood by those skilled in the art that various changes in form and details may be made without departing from the spirit and scope of the invention.

What is claimed is:

1. A method for the measurement of a leakage current within each cell of an array of SRAM cells to evaluate effects of modifying of a set of semiconductor process parameters, comprising the steps of:

a) subdividing a semiconductor wafer into a plurality of chip partitions;

b) placing a plurality of arrays of the SRAM cells within each of the plurality of chip partitions such that the array of SRAM cells are organized into rows and columns of SRAM cells, wherein each SRAM cell has two cross coupled field effect transistors, two transfer gate field effect transistors, a first load resistor, and a second load resistor;

c) placing a plurality of contact structures on each of the plurality of chip partitions for the connecting of a power supply voltage source to said chip partition;

d) connecting a first plurality and a second plurality of series connected resistors to each of the plurality of contact structures, wherein each resistor of the first and second plurality of series connected resistors is of a high resistance;

e) connecting one pass gate of a plurality of pass gates to each intersection of each pair of resistors of the first and second pluralities of series connected resistors, wherein each pass gate is a field effect transistor having a drain connected to the intersection of each pair of resistors, a gate connected to one pass gate select line of a plurality of pass gate select lines, and source;

f) connecting each first load resistor of each of the plurality of SRAM cells of the arrays of SRAM cells to the source of the field effect transistor that is a pass gate connected to the intersection of each pair of resistors of the first plurality of series connected resistors and connecting each second load resistor of each of the plurality of SRAM cells of the arrays of SRAM cells to the source of the field effect transistor that is a pass gate connected to the intersection of each pair of resistors of the second plurality of series connected resistors;

g) activating sequentially each pass gate select line of the plurality of pass gate select lines to couple one of the first and second load resistors to the intersection of the pair of resistors of the plurality of series connected resistors;

h) measuring a magnitude of the leakage current passing from the power supply voltage source through the plurality of series connected resistors, the pass gate, and the SRAM cell;

i) calculating an expected leakage current which is a quotient of a division of the magnitude of a threshold voltage of a field effect transistor subtracted from the magnitude of the power supply voltage source and a summation of a resistance of the load resistor and the resistance of the plurality of series connected resistors from the connection of the pass gate to the contact structure;

j) comparing the magnitude of the leakage current and the expected leakage current; and k) repeating of steps g, h, i, and j above to evaluate the effects of modifying said set of semiconductor process parameters upon the leakage current.

2. The method of claim 1 wherein the leakage current is a current passing from a the drain to the source of one of the cross coupled pair of field effect transistors of the SRAM cell that is being evaluated.

3. The method of claim 1 wherein the first and second load resistor are polysilicon resistors having a resistance on the order of $400 \times 10^9 \Omega$.

4. The method of claim 1 wherein the each resistor of the first and second plurality of series connected resistors is a polysilicon resistor having a resistance on the order of $500 \times 10^9 \Omega$.

5. The method of claim 1 wherein the activating of the pass gate select lines is controlled by a column decode means that will interpret an address from an external circuitry to select an appropriate pass gate for the measuring the leakage current.

6. The method of claim 1 wherein the repeating of the steps g, h, i, and j will accumulate a sampling of data that is sufficiently large without having to process large numbers of wafers.

7. An apparatus for the measurement of a leakage current within each cell of an array of SRAM cells to evaluate effects of modifying of a set of semiconductor process parameters, comprising:

a) a power supply voltage source;

b) a semiconductor wafer subdivided into a plurality of chip partitions, wherein each chip partition has:

a plurality of arrays of the SRAM such that the array of SRAM cells are organized into rows and columns of SRAM cells, wherein each SRAM cell has two cross coupled field effect transistors, two transfer gate field effect transistors, a first load resistor, and a second load resistor, a plurality of contact structures for the connecting of said power supply voltage source to said chip partition, a first plurality and a second plurality of series connected resistors connected to each of the plurality of contact structures, wherein each resistor of the first and second plurality of series connected resistors is of a high resistance, a plurality of pass gates whereby each pass gate is connected to each intersection of each pair of resistors of the first and second pluralities of series connected resistors, wherein said pass gate is a field effect transistor having a drain connected to the intersection of each pair of resistors, a gate connected to one of the plurality pass gate select lines, and a source connected to each first load resistor of each of the plurality of SRAM cells of the arrays of SRAM cells to the source of the field effect transistor that is a pass gate connected to the intersection of each pair of resistors of the first plurality of series connected resistors and connecting each second load resistor of each of the plurality of SRAM cells of the arrays of SRAM cells to the source of the field effect transistor that is a pass gate connected to the intersection of each pair of resistors of the second plurality of series connected resistors, and a column control circuit for the activation of each of the pass gates to selectively couple one of the first and second load resistors to the intersection of one of the pairs of resistors of the plurality of series connected resistors;

c) a current measuring means to measure the leakage current within each SRAM cell;

d) an activation means coupled to the control circuit to command said column control circuit to sequentially activate each pass gate select line; and e) a leakage current comparing means to compare each measurement from the current measurement means, as the activation means commands the column control circuit to sequentially activate each pass gate select line, with an expected leakage current, wherein the expected leakage current is calculated as a quotient of a division of the magnitude of a threshold voltage of a field effect transistor subtracted from the magnitude of said power supply voltage source and a summation of a resistance of the load resistor and the resistance of the plurality of series connected resistors from the connection of the pass gate to the contact structure.

8. The apparatus of claim 7 wherein the leakage current is a current passing from a the drain to the source of one of the cross coupled pair of field effect transistors of the SRAM cell that is being evaluated.

9. The apparatus of claim 7 wherein the first and second load resistor are polysilicon resistors having a resistance on the order of $400 \times 10^9 \Omega$.

10. The apparatus of claim 7 wherein the each resistor of the first and second plurality of series connected resistors is a polysilicon resistor having a resistance on the order of $500 \times 10^9 \Omega$.

11. The apparatus of claim 7 wherein said apparatus will allow the accumulation of a large sampling of data with having to process a large number of wafers.

* * * * *